United States Patent [19]

Severn

[11] Patent Number: 5,702,256

[45] Date of Patent: Dec. 30, 1997

[54] LAND GRID ARRAY SOCKET FOR USE WITH INTEGRATED CIRCUIT MODULES OF DIFFERENT SIZES INCLUDING MODULES WHICH ARE LARGER THAN THE SOCKET

[75] Inventor: E. Thomas Severn, El Dorado Hills, Calif.

[73] Assignee: Intel Corporation, Santa Clara, Calif.

[21] Appl. No.: 579,796

[22] Filed: Dec. 28, 1995

[51] Int. Cl.$^6$ ............................................................ H05K 1/00
[52] U.S. Cl. ............................................... 439/71; 439/526
[58] Field of Search ............................... 439/70, 71, 73, 439/525, 526, 330, 337

[56] References Cited

U.S. PATENT DOCUMENTS

| | | | |
|---|---|---|---|
| 4,554,505 | 11/1985 | Zachry | 439/71 |
| 5,215,472 | 6/1993 | DelPrete et al. | 439/71 |

*Primary Examiner*—Gary F. Paumen
*Assistant Examiner*—Christopher Goins
*Attorney, Agent, or Firm*—Cynthia Thomas Faatz

[57] ABSTRACT

A socket for coupling one of a first integrated circuit module having a first footprint and a first terminal array, or a second integrated circuit module having a second larger footprint to a printed circuit board. A socket base has a top surface for receiving one of the first and second integrated circuit modules and a bottom surface adapted to be mounted on a printed circuit board. A first array of contacts extends transversely through the base from the top surface to the bottom surface for electrically coupling the first terminal array to the printed circuit board. An alignment feature coupled to the base, is configured to align one of the first or second integrated circuit modules within the socket base such that the terminals of either the first or second integrated circuit modules engage the contact array, the second integrated circuit module extending beyond the alignment feature when aligned in the socket.

8 Claims, 5 Drawing Sheets

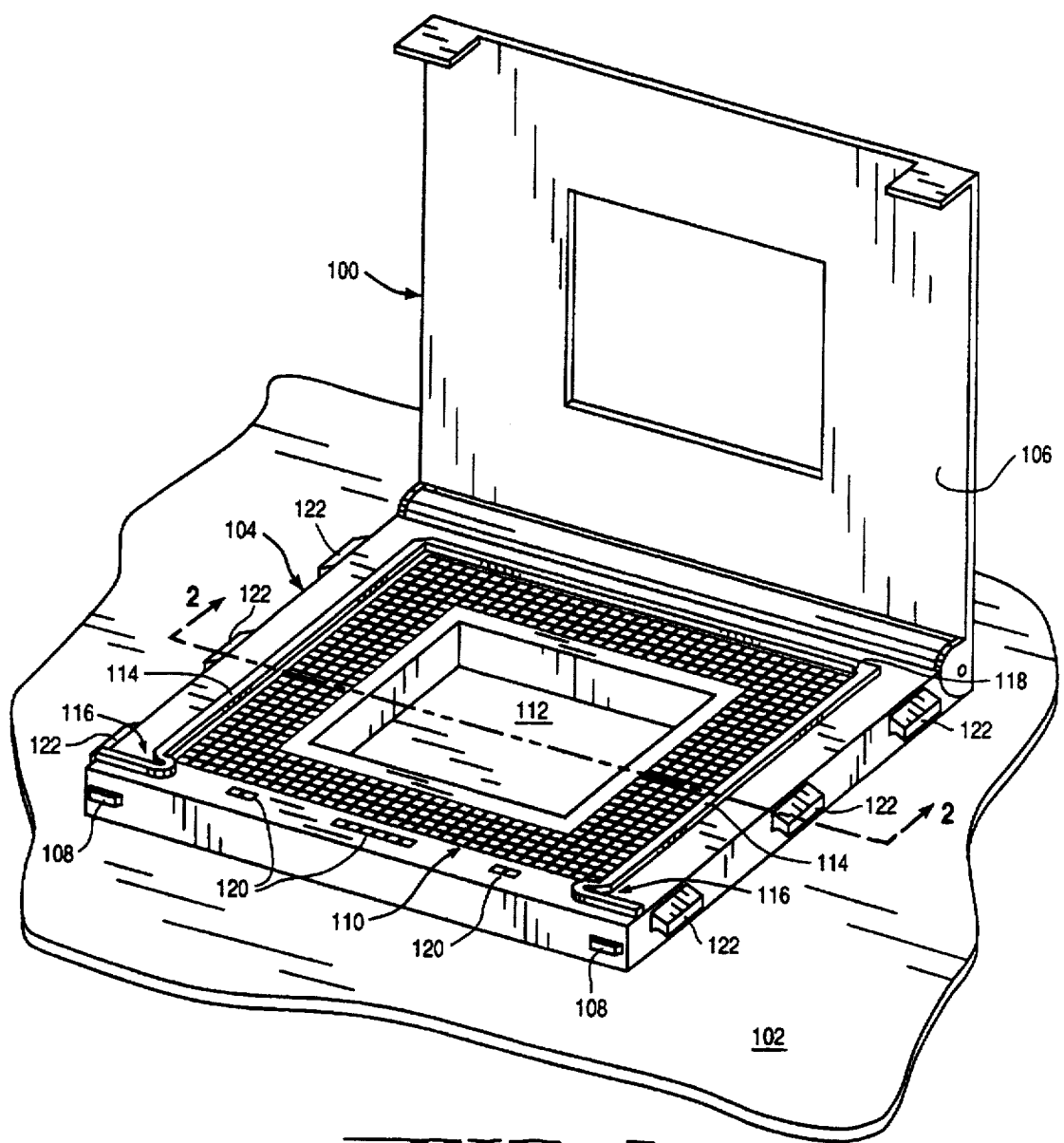
FIG_1
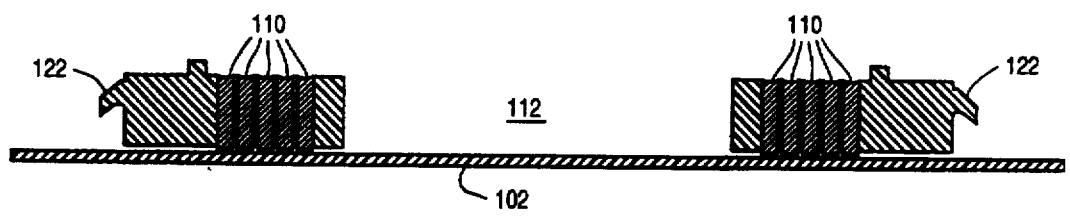
FIG_2

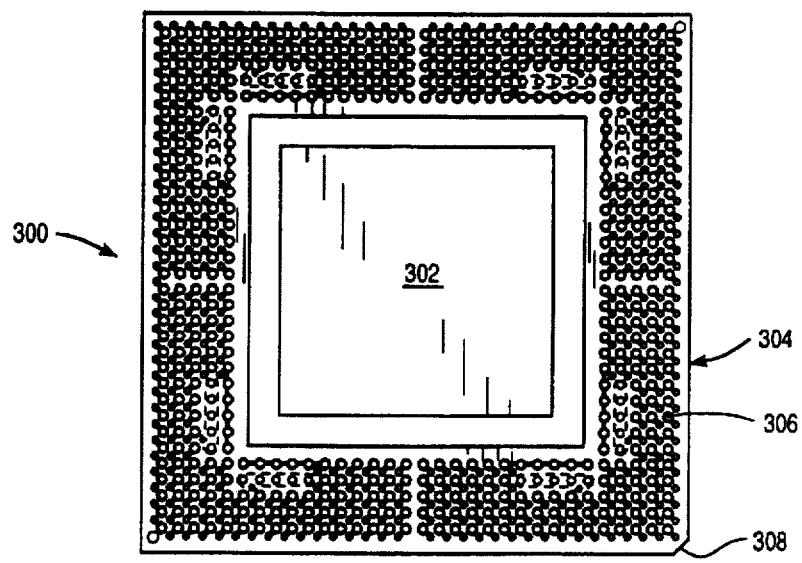
FIG_3A
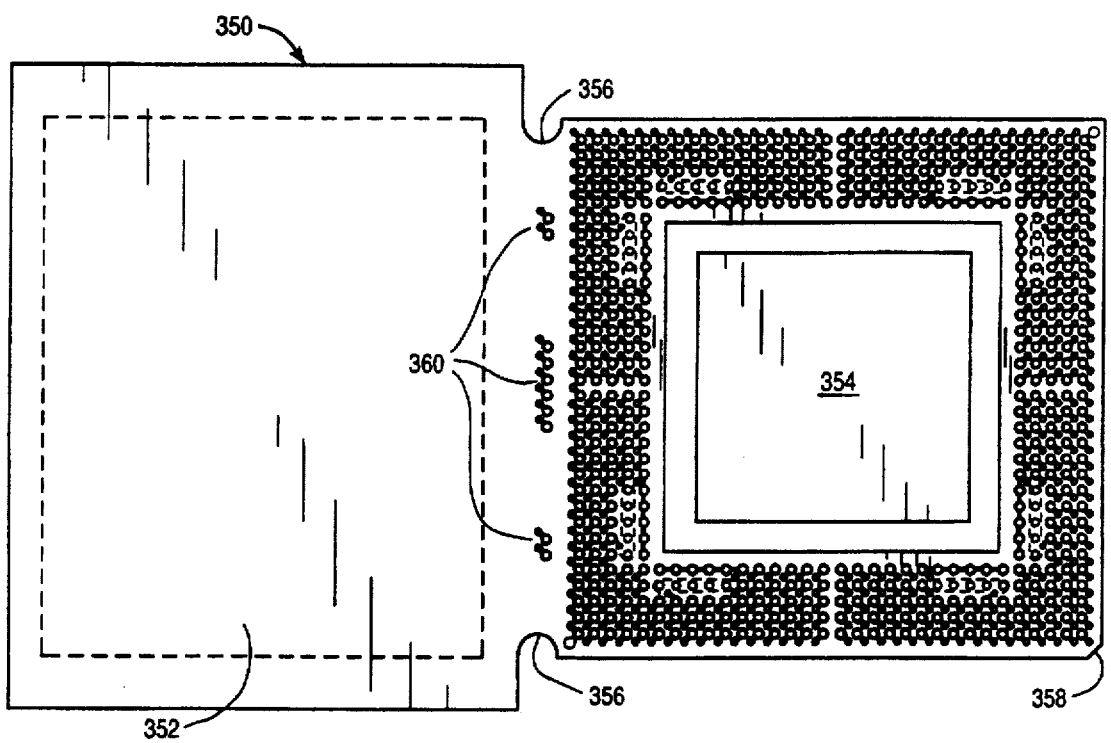
FIG_3B

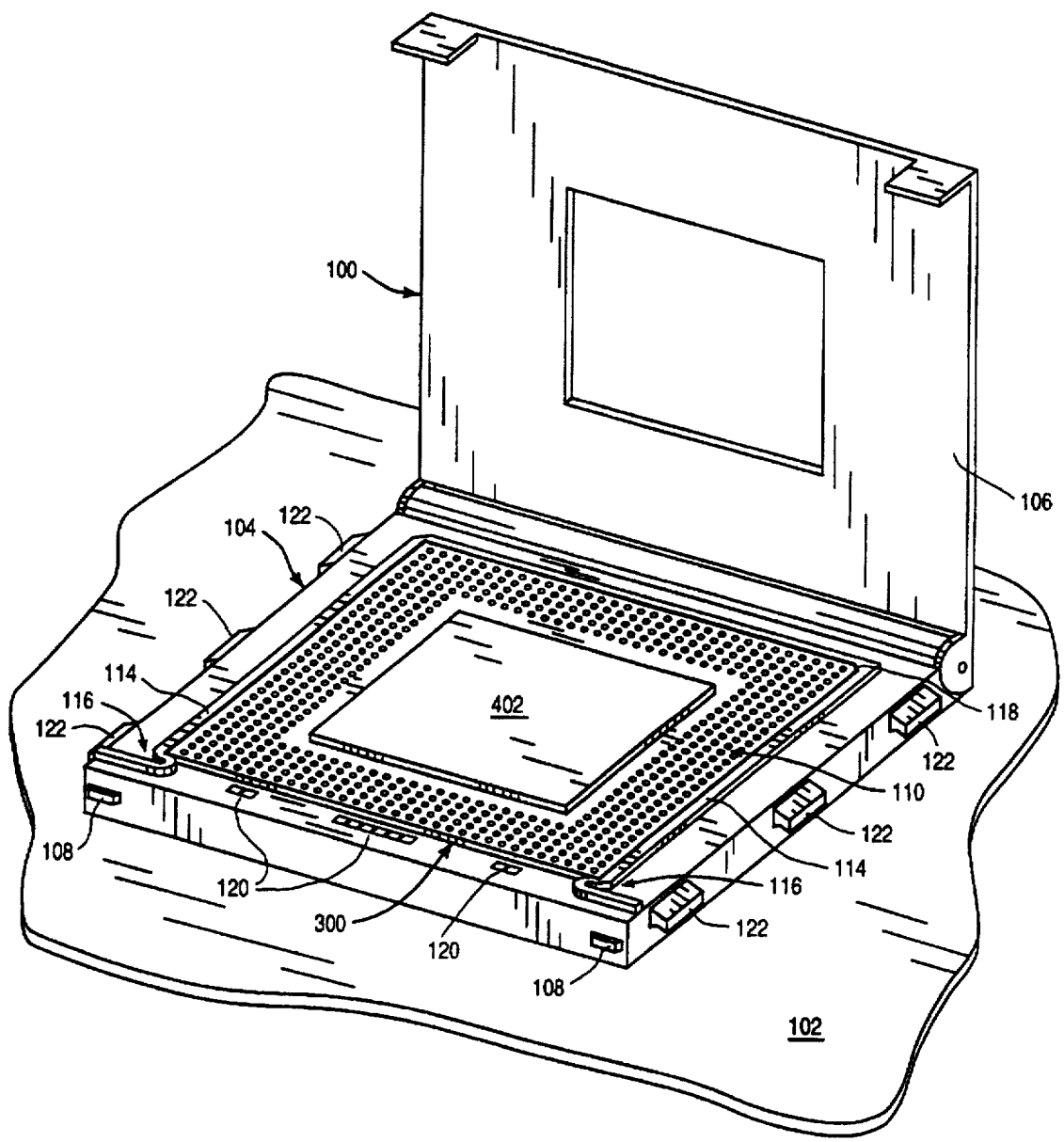
FIG_4

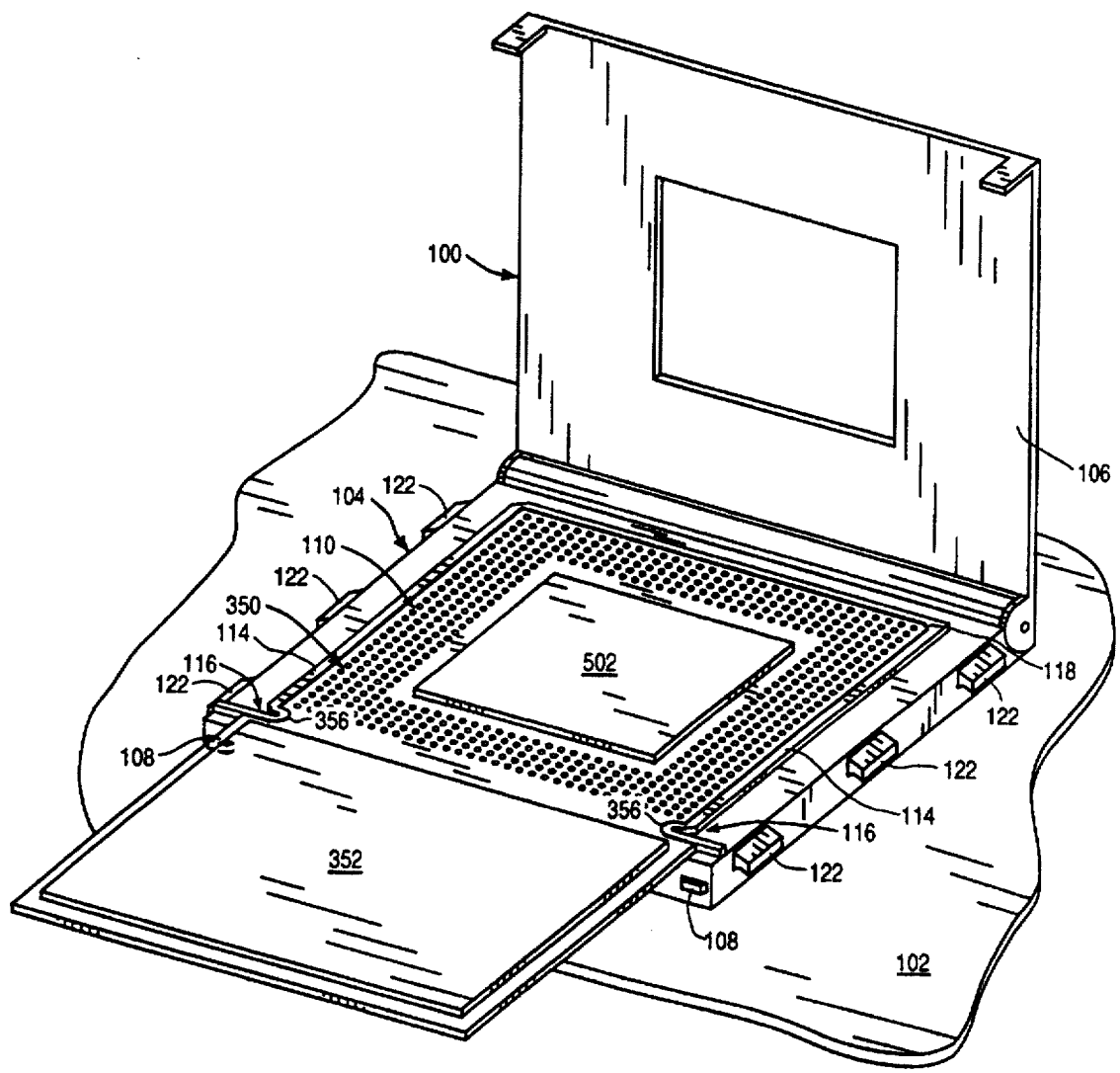
FIG_5

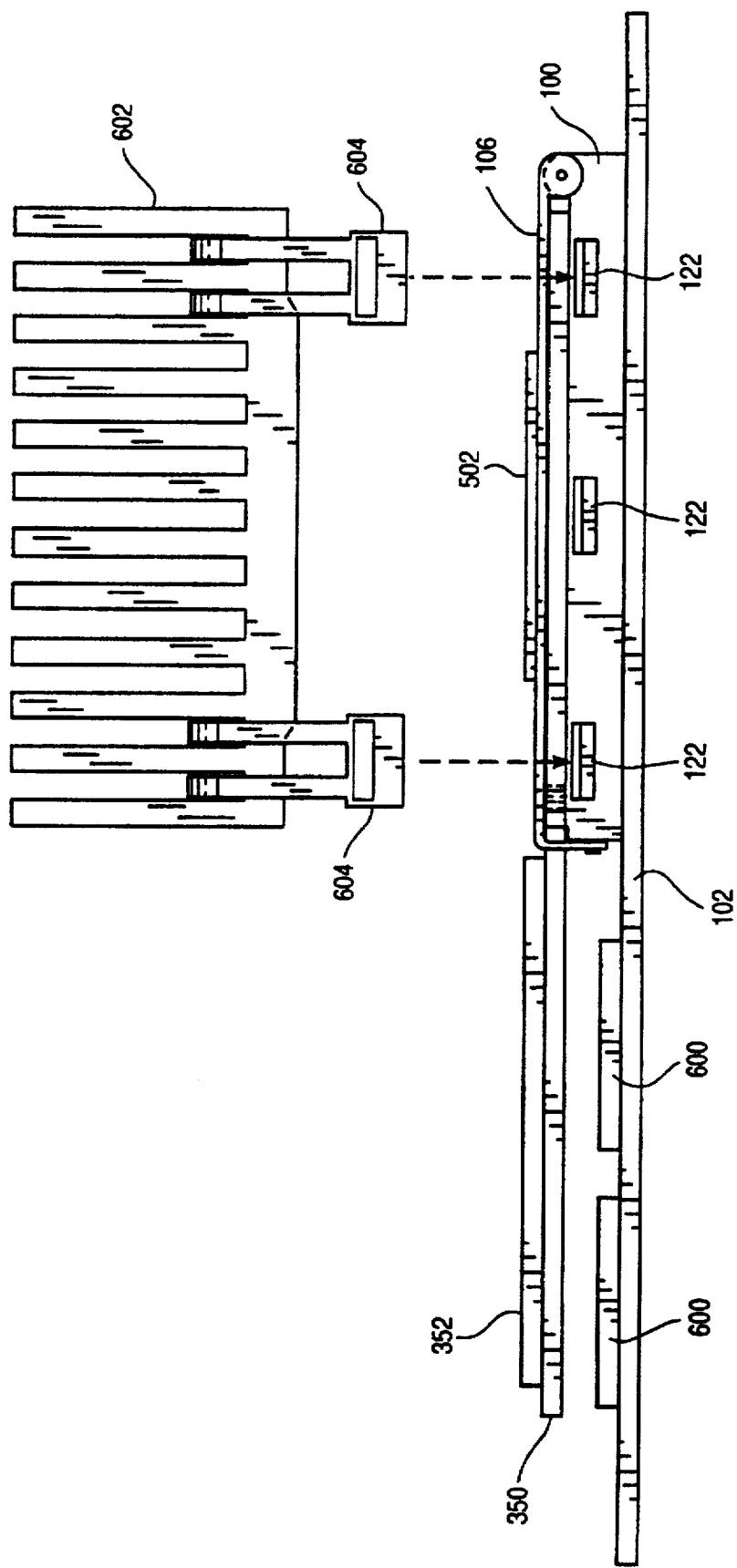
FIG_6

LAND GRID ARRAY SOCKET FOR USE WITH INTEGRATED CIRCUIT MODULES OF DIFFERENT SIZES INCLUDING MODULES WHICH ARE LARGER THAN THE SOCKET

BACKGROUND OF THE INVENTION

1. Field of the Invention

The present invention relates to the field of sockets for coupling integrated circuit modules to circuit boards. Specifically, the invention relates to a socket for use with integrated circuit modules including modules which may extend beyond the socket boundary.

2. Description of Related Art

Sockets and other similar types of electrical connectors are frequently used to connect integrated circuit devices or modules to printed circuit boards. Such connectors may be selected over direct surface mount or through-hole insertion techniques to provide additional versatility by enabling major computer system components, such as microprocessors, to be easily inserted, removed and replaced. Sockets are particularly useful, for example, in cases in which a computer system can be upgraded by removing the microprocessor and replacing it with a higher performance microprocessor. In this manner, a computer system user can take advantage of a more powerful microprocessor without having to replace his or her entire computer system.

In most cases, the socket for connecting the original microprocessor or other computer system component to a printed circuit board within the computer system is soldered, or otherwise hardwired to the board, such that it is not easily removed. For this reason, upgrade or replacement parts must generally fit within the existing socket in order to provide for straightforward field replacements. This constraint can limit the range of design choices available when designing upgrade and replacement modules.

For example, some of the latest microprocessor devices are packaged in land grid array (LGA) packages or modules. LGA packages are ideal for devices such as microprocessors because the LGA package uses pads, instead of pins which are more susceptible to damage, to provide the required electrical connections between the integrated circuit device and the circuit board, such that the pitch of the electrical contacts can be very small. Typical LGA sockets include a base for seating the LGA package which has a recessed portion in the middle of the socket base corresponding to the footprint of the LGA package to be inserted in the socket. This recessed portion operates to align the integrated circuit module to the electrical contacts within the socket, but also prevents the integrated circuit module from extending beyond the socket boundary. LGA sockets also typically include the same number of contacts providing electrical connections from the package to the circuit board, as the number of pads on the LGA package.

Currently, an LGA integrated circuit module designed to upgrade or replace a first, socketed LGA module in a computer system must conform to the footprint and land pad pattern of the first module. Thus, there is an issue in providing upgrade or replacement modules which are either larger than the originally socketed device, or require one or more additional devices, such as a faster cache memory, to ensure that the computer system can take full advantage of the higher performance device. Further, currently available sockets do not provide for additional connections between the socket and the circuit board, such as may be required for multiple supply voltages for an additional device, for example, if those same connections were not provided for the first device.

Replacing the socket with a larger socket on the same board, as mentioned above, is often not feasible, especially if the socket is surface mounted or connected to the circuit board such that it is not easily detachable. Further, due to circuit board layout constraints, it may not be possible to fit a larger electrical connector in the same space without interfering with other integrated circuit devices.

Thus, it is desirable to have a socket which accommodates both a first integrated circuit module having a first footprint, and a second single, or multi-die module which having a larger footprint and extending beyond the boundary of the socket, to provide flexibility for easy upgrades and replacements. Further, it is desirable to have a socket which provides for additional connections between an integrated circuit module and a circuit board not required by the first integrated circuit module, such that multiple supply voltages, or additional signals may be provided to an upgrade or replacement module.

SUMMARY OF THE INVENTION

A land grid array socket for coupling either a first integrated circuit module having a first footprint and a first set of terminals or a second integrated circuit module having a larger footprint and a second set of terminals to a printed circuit board is described. The socket of the invention includes a socket base having a top surface for receiving one of the first or second integrated circuit modules and a bottom surface adapted to be mounted on a printed circuit board. A first array of contacts extends transversely through the socket base from the top surface to the bottom surface for electrically coupling the socket base to the printed circuit board. The socket of the invention also includes an alignment feature coupled to the base, the alignment feature configured to align the first or second integrated circuit module within the socket base such that the terminals of either the first or second integrated circuit modules engage the contact array, the alignment feature including at least one opening such that the second integrated circuit module can extend beyond the socket base when aligned in the socket.

BRIEF DESCRIPTION OF THE DRAWINGS

The invention is illustrated by way of example, and not limitation in the accompanying drawings in which like references indicate similar elements and in which:

FIG. 1 is a perspective view of a socket according to one embodiment of the invention coupled to a printed circuit board.

FIG. 2 is a cross-sectional view of the socket of FIG. 1 taken along the line 2—2 of FIG. 1.

FIG. 3A is bottom view of an integrated circuit module which may be advantageously coupled to a printed circuit board using the socket of FIG. 1.

FIG. 3B is a bottom view of a second integrated circuit module which may be advantageously coupled to a printed circuit board using the socket of FIG. 1.

FIG. 4 is a perspective view of the integrated circuit module of FIG. 3A seated and aligned in the socket of FIG. 1.

FIG. 5 is a perspective view of the integrated circuit module of FIG. 3B seated and aligned in the socket of FIG. 1.

FIG. 6 is a side view of the socket of FIG. 1 bearing the integrated circuit module of FIG. 3B and illustrating a heat sink which may be coupled to the socket of the invention.

For purposes of illustration, these figures are not necessarily drawn to scale.

DETAILED DESCRIPTION OF THE INVENTION

A socket which accommodates either a first integrated circuit module having a first footprint, or a second single, or multi-die module having a larger footprint and extending beyond the boundary of the socket is described. In the following description, specific details are set forth in order to provide a thorough understanding of the invention. However, it will be appreciated by one skilled in the art that the invention may be practiced without these specific details. In other instances, well-known elements have not been shown or described in order to avoid obscuring the invention. Accordingly, the specification and drawings are to be regarded in an illustrative rather than a restrictive sense.

FIG. 1 illustrates a perspective view of a socket 100 in accordance with one embodiment of the invention mounted on a printed circuit board 102. The socket 100 includes a socket base 104 formed of a non-conductive material having a top surface for receiving an integrated circuit module and a bottom surface adapted to be coupled to a printed circuit board. In one embodiment, the socket 100 of the invention also includes a socket lid 106 which operates to retain an integrated circuit module within the socket 100 once it is properly aligned and engaged with the contacts of the invention as described below. The socket lid 106 of the invention may operate through the use of an actuator (not shown) or may simply close and open by latching and unlatching an edge of the lid 106 on a portion of the socket base 104, such as latches 108. In alternate embodiments, the socket of the invention uses a different type of retention device, such as a clip, to retain an integrated circuit module seated and aligned within the socket base.

The socket base 104 includes a first array of contacts shown as the central contact array 110 formed to receive corresponding terminals (pads, leads or pins) of an integrated circuit module. In the embodiment shown in FIG. 1, the contacts of the contact array 110 are designed to receive land pads of a land grid array (LGA) integrated circuit module although different types of contacts are also within the scope of the invention.

The contacts 110 are formed of a conductive material such as gold plating over phosphor-bronze in one embodiment, and extend transversely through the base from the top surface of the base to the bottom surface of the base. The contacts 110 operate to electrically couple the socket base and an integrated circuit module to the underlying printed circuit board 102 when the socket 100 is mounted on the board 102, and the integrated circuit module is seated properly within the socket 100 so as to engage the contacts 110. The contacts 110 may provide for the socket 100 to be surface mounted onto the printed circuit board 102 or the contacts 110 may be through-hole contacts providing for through-hole insertion mounting of the socket 100 on the printed circuit board 102. The contact array 110 is arranged around an open area 112 in the socket 100 in one embodiment, to accommodate a particular integrated circuit module configuration. In one embodiment, the open area 112 corresponds to the area of an integrated circuit device when the module which includes the device is aligned in the socket 100. In alternate embodiments, the socket base may not include an open area and the contact array may be arranged differently to correspond to a terminal pattern of a different integrated circuit module.

The socket base 104 of the invention also includes an alignment feature 114 for aligning an integrated circuit device package or module within the socket 100. The alignment feature 114 of one embodiment of the invention extends around the edges of the first array of contacts 110 in a rectangular formation with an opening at one edge of the array. The shape of the alignment feature 114 of the invention corresponds to a portion of the outline of an integrated circuit module to be inserted into the socket 100. In this manner, the alignment feature 114 provides for accurate alignment of the integrated circuit module such that its terminals align correctly with the contacts 110 of the socket base 104. Rounded portions 116 of the alignment feature 114 are included in one embodiment to provide further assurance of proper alignment for specific integrated circuit modules. Different types of key features may be included in other embodiments to align integrated circuit modules having different shapes.

The opening in the alignment feature provides for an integrated circuit module to extend beyond the alignment feature, and even outside the socket 100 boundary when the integrated circuit module is properly seated within the socket 100. In this manner, the socket 100 of the invention accommodates integrated circuit modules of different sizes while still providing accurate alignment of each of the modules in the socket 100. For example, the socket 100 of the invention is capable of reliably socketing a first integrated circuit module which fits entirely within the socket boundary, or a second integrated circuit module which extends beyond the socket boundary. A more detailed example of the functionality of the socket of the invention is described below with reference to FIGS. 4 and 5.

In alternate embodiments, the alignment feature of the invention has a different shape which provides for accurate alignment while including one or more openings in the alignment feature to provide for one or more edges of an integrated circuit module properly seated within the socket 100 to extend beyond the boundary of the socket base 104. For example, in one embodiment, the alignment feature of the invention includes a raised area at each of the four corners of the contact array and has openings on three sides to allow an integrated circuit module to extend outside of the socket boundary in multiple directions.

In one embodiment, the alignment feature 114 of the invention also includes an orientation feature 118 providing for proper orientation of an integrated circuit module within the socket base 104. Proper orientation of an integrated circuit module within the socket base is very important to ensure that the correct electrical signals are provided to the integrated circuit module when it is coupled to a printed circuit board using the socket 100 of the invention. In other embodiments, an orientation feature is not included or has a different shape providing for a unique orientation of an integrated circuit module in the socket 100. Further, while one orientation feature 118 is illustrated, alternate embodiments may include a different number of orientation features.

The socket base 104 of one embodiment of the invention also includes supplemental contacts 120. The supplemental contacts 120 of one embodiment operate to provide additional connections between an integrated circuit module seated within the socket 100, and the printed circuit board 102 upon which the socket 100 is mounted. The supplemental contacts 120 have the same characteristics as the contacts of the first contact array 110, i.e. they extend through the socket base 104, are formed of conductive material, and are designed to receive land pads of an LGA package in one embodiment.

The supplemental contacts 120 of the invention can be used to provide additional connections for an integrated circuit module, such as a microprocessor upgrade module, which extends beyond the socket 100 boundary. Further, if the microprocessor or other upgrade or replacement module includes a second device, the supplemental contacts 120 can be used to provide a different voltage supply to the second device. Supplemental contacts 120 such as those illustrated in FIG. 1, may be located at different places on the socket of the invention, may include a different number of contacts, or the socket of the invention may not include supplemental contacts. The operation of the supplemental contacts 120 of the invention are described in more detail below with reference to FIGS. 5, and 6.

One embodiment of the socket 100 of the invention also includes heat sink attachment features such as the heat sink lugs 122. The heat sink lugs provide an easy attachment mechanism for certain heatsinks having corresponding attachment features once an integrated circuit module is seated and aligned in the socket 100 of the invention.

FIG. 2 illustrates a cross-sectional view of the socket 100 of FIG. 1 taken along line 2—2. As described above, the contacts forming the first contact array 110 extend through the socket base 104 from a top surface of the base to a bottom surface of the base to provide electrical coupling of an integrated circuit module to a printed circuit board 102. FIG. 2 also illustrates a cross-section of two of the heat sink lugs of one embodiment of the invention which are adapted such that a heat sink having corresponding attachment features may be easily clipped on to the socket 100 of the invention to provide for effective thermal management. In other embodiments, the socket of the invention does not include heat sink lugs and a heat sink may be attached directly to an integrated circuit module inserted within the socket, or attached to the socket of the invention in a different manner.

FIGS. 3A and 3B illustrate examples of integrated circuit modules which may be advantageously coupled to a printed circuit board using the embodiment of the socket 100 of the invention illustrated in FIG. 1. FIG. 3A illustrates a bottom view of an integrated circuit module 300 including a single integrated circuit device 302 in an LGA package 304 having a footprint defined by the outside edges of the LGA package 304. The integrated circuit device 302 may be a microprocessor or any other type of integrated circuit device. The single device integrated circuit module 300 includes an array of terminals 306, LGA land pads in this example, for electrically coupling the integrated circuit device 302 to external signals. The array of terminals 306 on the LGA package 304 of FIG. 3A corresponds to the pattern of the contact array 110 of FIG. 1. The terminals 306 are electrically coupled to the contact array 110 of the socket 100 of FIG. 1 when the integrated circuit module is properly seated and aligned within the socket 100. The integrated circuit module 300 also includes an orientation feature 308 which corresponds to the orientation feature 118 of the socket 100 to provide for proper orientation of the module 300 in the socket 100.

FIG. 3B illustrates an example of a second integrated circuit module 350 which may also be advantageously coupled to a printed circuit board using the socket 100 of FIG. 1. The integrated circuit module 350 of FIG. 3B is also an LGA module, but has a larger footprint, and includes two integrated circuit devices 352 and 354. The first integrated circuit device 354 is mounted on the bottom of the module 350 as shown. The second integrated circuit device 352 is mounted on the top of the module 350 in the area defined by the dotted line. The LGA module 350 of FIG. 3B, may, for example, be an upgrade module for the integrated circuit module 300 of FIG. 3A. In this case, the first device 354 may be a higher performance microprocessor and the second device 352 may be a faster cache memory than an existing cache memory in the computer system. In this example, the portion of the LGA module 350 including the first device 354 corresponds to the footprint of the integrated circuit module 300 of FIG. 3A. In this manner, the alignment feature 114 of the socket 100 correctly aligns either the integrated circuit module 300 of FIG. 3A, or the portion of the integrated circuit module 350 of FIG. 3B with the corresponding footprint including the integrated circuit device 354.

The integrated circuit module 350 of FIG. 3B includes notches 356 which correspond to the rounded portions 116 of the alignment feature in the socket base 104 of FIG. 1, and an orientation feature 358 corresponding to the orientation feature 118 of the socket 100. In this manner, the proper orientation and alignment of the integrated circuit module 350 of FIG. 3B is assured when the module 350 is inserted into the socket 100 of the invention. Integrated circuit modules for use with the socket of the invention may not include notches or may include different features which correspond to different alignment feature configurations in sockets of alternate embodiments of the invention.

The LGA module 350 of FIG. 3B also includes supplemental terminals 360 which provide for additional signals to the second device. The supplemental terminals 360 may be used to provide additional external signals to the second device 352 or to provide an alternate power supply to the second device 352. The pattern of the supplemental terminals 360 of the LGA module 350 of FIG. 3B corresponds to the pattern of the supplemental contacts of the socket 100 of FIG. 1, such that the supplemental terminals 360 of the LGA module align with the supplemental contacts of the socket 100 when the module of FIG. 3B is seated and aligned within the socket 100 of FIG. 1.

FIG. 4 illustrates the integrated circuit module 300 of FIG. 3A seated and aligned in the socket 100 of FIG. 1, the socket 100 of FIG. 1 having the socket lid 106 in an open position. The top side of the integrated circuit module 300 is shown in FIG. 4 and includes a heat slug 402 in one embodiment to assist in thermal management of the integrated circuit device 302 mounted on the opposite side of the module 300. The alignment feature 114 of the invention properly aligns the integrated circuit module 300 of FIG. 3A in the socket 100 such that the terminals of the integrated circuit module engage with the contact array of the socket 100 of FIG. 1.

FIG. 5 illustrates the integrated circuit module 350 of FIG. 3B seated and aligned in the socket 100 of FIG. 1. The top side of the integrated circuit module 350 is shown in FIG. 5 and includes the second device 352 mounted on the top side of the module. Also, in this example, the integrated circuit module 350 includes a heat slug 502 mounted on the integrated circuit module opposite the first integrated circuit device 354 to provide for cooling of the device. As illustrated, the alignment feature 114 of the socket 100 also aligns the portion of the LGA module 350 including the integrated circuit device 354 and having a same footprint as the integrated circuit module 300 of FIG. 3A. The remaining portion of the integrated circuit module 352 extends outside of the alignment feature and the socket 100 as shown. The notches 356 of the LGA module of FIG. 3B engage with the rounded portions 116 of the socket alignment feature 114 such that the module 350 is properly aligned within the socket 100. When properly aligned, the terminals of the LGA module 350 are coupled to the central contacts of the socket 100 and to the supplemental terminals.

FIG. 6 illustrates a side view of the socket 100 of one embodiment of the invention bearing the integrated circuit module 350 of FIG. 3B. In FIG. 3B, the socket lid 106 is shown in a closed position with the heat slug 502 extending through an open area in the lid. As shown, the socket 100 of the invention provides an additional advantage. The height of the socket base 104 is large enough in one embodiment such that the end of the integrated circuit module 350 including the integrated circuit device 352 which extends outside of the socket boundary, clears neighboring integrated circuit devices 600 mounted to the printed circuit board 102. In this manner, the same socket can be used for a first module having a first footprint and fitting within the socket boundary when properly aligned in the socket, and a second integrated circuit module having a significantly larger footprint, without requiring changes in the printed circuit board layout or wasting valuable printed circuit board area.

The heatsink 602 may be attached to the socket 100 of the invention or directly to the top of the integrated circuit module 350 seated and aligned within the socket 100 of the invention as shown. The heatsink 602 includes heat sink clips 604 such that it may be clipped onto the socket 100 using the heat sink lugs 122. Alternatively, the heatsink 602 may be attached to the socket or to the integrated circuit device module using another heatsink attachment approach.

The socket of the invention thus provides accurate alignment and socketing of different sizes of integrated circuit devices thereby providing additional flexibility to upgrade or replacement socket designers while ensuring easy field replacement. The supplemental contacts of one embodiment also provide additional signals where required for multi-device or other types of replacement modules needing additional signals including a different power supply.

Whereas many alterations and modifications of the invention will no doubt be appreciated by one of ordinary skill in the art after having read the foregoing description, it is understood that the particular embodiments shown and described by way of illustration are in no way intended to be considered limiting. Therefore, references to details of the individual embodiments are not intended to limit the scope of the claims which in themselves recite only those features regarded as essential to the invention.

What is claimed is:

1. A socket for coupling a land grid array (LGA) module to a circuit board, the LGA module having a first set of land pads for coupling a first integrated circuit device on the LGA module to a circuit board, the socket comprising:

a non-conductive base for seating the LGA module in the socket;

a first set of contacts extending through the base for electrically coupling the socket to the circuit board; and an alignment feature configured on the base around the first set of contacts for aligning the LGA module in the socket such that the first set of land pads is aligned with the first set of contacts, the alignment feature having an opening providing for at least one side of the LGA module to extend outside of the socket boundary.

2. The socket as set forth in claim 1 further including a second set of contacts extending through the socket base from the top surface to the bottom surface, wherein the land grid array module includes a second set of land pads, the second set of land pads aligning with the second set of contacts when the land grid array module is aligned in the socket by the alignment feature.

3. The socket as set forth in claim 1 wherein the alignment feature extends around the first set of contacts with an opening at one side.

4. The socket as set forth in claim 1 wherein the alignment feature includes key features at either side of the opening in the alignment features and wherein the land grid array module includes notches which interlock with the key features of the alignment feature to secure the land grid array module in the socket base when the land grid array module is aligned with the alignment feature.

5. The socket as set forth in claim 1 further including a socket lid coupled to the socket base, the socket lid having an open and a closed position, the socket lid retaining the land grid array module seated and aligned in the socket base when the socket lid is in a closed position.

6. The socket as set forth in claim 1 further including heat sink attachment features for attaching a heat sink to the socket base.

7. The socket as set forth in claim 1 wherein the first integrated circuit device is a microprocessor and the LGA module includes a second device, the second device being a cache memory device.

8. The socket as set forth in claim 1 wherein the printed circuit board includes one or more devices coupled to the printed circuit board and wherein the socket base has height such that the land grid array module extends above the one or more devices when the land grid array module is aligned in the socket and extends outside the socket.

* * * * *